(12) United States Patent
Dokumaci et al.

(10) Patent No.: US 6,911,384 B2
(45) Date of Patent: Jun. 28, 2005

(54) GATE STRUCTURE WITH INDEPENDENTLY TAILORED VERTICAL DOPING PROFILE

(75) Inventors: Omer Dokumaci, Wappingers Falls, NY (US); Bruce B. Doris, Brewster, NY (US); Oleg Gluschenkov, Wappingers Falls, NY (US); Jack A. Mandelman, Flat Rock, NC (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,697

(22) Filed: Oct. 21, 2003

(65) Prior Publication Data

US 2004/0106274 A1 Jun. 3, 2004

Related U.S. Application Data

(62) Division of application No. 10/301,436, filed on Nov. 21, 2002, now Pat. No. 6,686,637.

(51) Int. Cl.[7] .......................................... H01L 21/3205
(52) U.S. Cl. ....................... 438/592; 438/653; 438/655; 438/684
(58) Field of Search ................................ 438/592, 653, 438/655, 684, 761

(56) References Cited

U.S. PATENT DOCUMENTS

| | | | |
|---|---|---|---|
| 5,796,166 A | 8/1998 | Agnello et al. ............. 257/751 |
| 5,885,887 A | 3/1999 | Hause et al. ................ 438/564 |
| 5,925,918 A | 7/1999 | Wu et al. .................... 257/413 |
| 5,998,289 A | 12/1999 | Sagnes ........................ 438/592 |
| 6,208,004 B1 | 3/2001 | Cunningham ............... 257/413 |
| 6,259,144 B1 | 7/2001 | Gonzalez .................... 257/412 |
| 6,271,590 B1 | 8/2001 | Akram et al. ............... 257/748 |
| 6,274,467 B1 | 8/2001 | Gambino et al. ........... 438/563 |
| 6,281,059 B1 | 8/2001 | Cheng et al. ................ 438/200 |
| 6,291,868 B1 | 9/2001 | Weimer et al. ............. 257/413 |
| 6,310,361 B1 | 10/2001 | Lichter ......................... 257/48 |
| 6,333,244 B1 | 12/2001 | Yu ............................... 438/528 |
| 6,335,248 B1 | 1/2002 | Mandelman et al. ....... 438/279 |
| 6,372,618 B2 * | 4/2002 | Forbes et al. ............... 438/596 |
| 6,380,055 B2 * | 4/2002 | Gardner et al. ............. 438/585 |
| 6,404,021 B1 | 6/2002 | Koizumi et al. ............ 257/381 |
| 6,573,169 B2 * | 6/2003 | Noble et al. ................ 438/592 |
| 6,611,032 B2 | 8/2003 | Schuegraf et al. .......... 257/412 |
| 6,713,359 B1 * | 3/2004 | Mizushima et al. ........ 438/300 |
| 6,737,320 B2 * | 5/2004 | Chen et al. ................. 438/257 |

OTHER PUBLICATIONS

V. L. Rideout; "Fabricating Low Resistance Interconnection Lines and FET Gates in a Single Step;" IBM Technical Disclosure Bulletin, vol. 21, No. 3, Aug. 1978; pp. 1250–1251.

Mitra Navi and Scott T. Dunham; "Investigation of Boron Penetration Through Thin Gate Dielectrics Including Role of Nitrogen and Fluorine;" J. Electrochem. Soc., vol. 15, No. 7, Jul. 1998; pp. 2545–2458.

Richard B. Fair, "Modeling Boron Diffusion in Ultrathin Nitrided Oxide p+ Si Gate Technology;" IEEE Electron Device Letters, vol. 18, No. 6, Jun. 1997; pp. 244–247.

* cited by examiner

*Primary Examiner*—Amir Zarabian
*Assistant Examiner*—Christy Novacek
(74) *Attorney, Agent, or Firm*—Lisa U. Jaklitsch; Cantor Colburn LLP

(57) ABSTRACT

A gate structure for a semiconductor transistor is disclosed. In an exemplary embodiment, the gate structure includes a lower polysilicon region doped at a first dopant concentration and an upper polysilicon region doped at a second concentration, with the second concentration being different than the first concentration. A conductive barrier layer is disposed between the lower and the upper polysilicon regions, wherein the conductive barrier layer prevents diffusion of impurities between the lower and the upper polysilicon regions.

14 Claims, 4 Drawing Sheets

GATE STRUCTURE WITH INDEPENDENTLY TAILORED VERTICAL DOPING PROFILE

CROSS REFERENCE TO RELATED APPLICATIONS

This is a divisional of U.S. patent application Ser. No. 10/301,436, entitled "GATE STRUCTURE WITH INDEPENDENTLY TAILORED VERTICAL DOPING PROFILE," filed Nov. 21, 2002, now U.S. Pat. No. 6,686,637, which is incorporated herein by reference.

BACKGROUND OF INVENTION

The present invention relates generally to semiconductor device processing and, more particularly, to a semiconductor transistor gate structure having an independently tailored vertical doping profile.

Polycrystalline silicon (polysilicon or poly-Si) has become the preferred material for gate electrodes in MOSFET structures. In particular, polysilicon is advantageous over metal gate electrodes in that it can withstand much higher subsequent processing temperatures before eutectic temperatures are reached. In addition, polysilicon is readily deposited on bulk silicon or silicon dioxide ($SiO_2$) using low pressure chemical vapor deposition (LPCVD).

State of the art MOSFET transistors are fabricated by depositing a gate stack material over the gate oxide and substrate. Lithography and etch processes are used to define the poly-Si gate structures, and both the gate structure and silicon substrate are then thermally oxidized. Subsequently, source/drain (S/D) extensions and halos are implanted. Such implants are typically performed through the use of spacers in order to create a specific distance between the gate and the implanted junction. In certain instances, the S/D extensions for an NFET device will be implanted without spacers, while the S/D extensions for a PFET device will be implanted with spacers present. A thicker spacer is typically formed before the S/D extensions have been implanted. Thereafter, deep S/D implants are then performed with the thicker spacers present. High temperature anneals are then performed in order to activate the junctions.

As the drive toward integrating more active devices on a single integrated circuit necessitates the fabrication of increasingly small MOSFET structures, the resistance of the MOSFET gate becomes a limiting factor in device speed. Thus, it is beneficial to use materials with the lowest possible sheet resistivities for making contact with the polysilicon gate structure. To this end, it is well known that refractory metal suicides may be readily formed on polysilicon MOSFET gate structures by using conventional sputtering, deposition, and annealing processes. The refractory metal suicides have relatively low sheet resistivities after annealing, and also form low resistance ohmic contacts with commonly used interconnect metals. Accordingly, once the junctions are activated by the high temperature anneal, both the S/D regions and the top portion of the gate are silicided.

In order to both sufficiently increase the poly-Si activation and minimize poly-Si depletion effects, the gate is doped at a relatively high dopant concentration. Unfortunately, when the gate is heavily doped, the high dopant concentration can also adversely affect silicidation on the gate, particularly as the gate line width decreases below the 0.1 $\mu$m threshold. Because proper silicide formation is integral in achieving low resistance gates (and therefore reduced signal propagation delay), it is also desirable to have a gate structure wherein the bottom portion of the gate is heavily doped to minimize the poly-Si depletion effects while, at the same time, the top portion of the gate is more lightly doped for proper silicide formation. However, with current device processing methods, even if a separate, lightly doped implant is performed for the top portion gate, the subsequent annealing process causes a redistribution of the dopant within the gate, thereby resulting in a relatively uniform vertical dopant concentration.

SUMMARY OF INVENTION

The foregoing discussed drawbacks and deficiencies of the prior art are overcome or alleviated by a gate structure for a semiconductor transistor. In an exemplary embodiment, the gate structure includes a lower polysilicon region doped at a first dopant concentration and an upper polysilicon region doped at a second concentration, with the second concentration being different than the first concentration. A conductive barrier layer is disposed between the lower and the upper polysilicon regions, wherein the conductive barrier layer prevents diffusion of impurities between the lower and the upper polysilicon regions.

In another aspect, a MOS transistor device includes a source diffusion region and a drain diffusion region. A gate stack structure disposed upon a gate dielectric, the gate stack structure further including a lower polysilicon region doped at a first dopant concentration, a conductive barrier layer disposed on the lower polysilicon region, and an upper polysilicon region disposed on the conductive barrier layer. The upper polysilicon region is doped at a second concentration that is different than the first concentration, and wherein the conductive barrier layer prevents diffusion of impurities between the lower and the upper polysilicon regions.

In yet another aspect, a method for forming a gate structure for a semiconductor transistor includes forming a lower polysilicon region on a gate dielectric layer. The lower polysilicon region is implanted with a dopant at a first dopant concentration. Then, a conductive barrier layer is formed upon lower polysilicon region, and an upper polysilicon region is formed upon the conductive barrier layer. The upper polysilicon region is implanted at a second dopant concentration, said second concentration being lower than said first concentration.

BRIEF DESCRIPTION OF DRAWINGS

Referring to the exemplary drawings wherein like elements are numbered alike in the several Figures.

DETAILED DESCRIPTION

Disclosed herein is a gate structure for a MOS transistor device having improved gate activation characteristics and without degraded gate line resistance, wherein unwanted impurities are prevented from adversely affecting the gate characteristics of high performance MOS transistors. Briefly stated, the gate structure includes a lower polysilicon region and a upper polysilicon region separated from one another by a conductive diffusion barrier. The lower polysilicon region is doped at a first concentration that is substantially different (e.g., higher) than a second concentration used in the doping of the upper polysilicon region.

The diffusion barrier thus allows for the independent adjustment of the doping profile between the lower and upper poly-Si regions of the gate, and further prevents diffusion of impurities between the upper and lower regions during annealing. Thereby, the silicidation problems caused by a high dopant concentration are alleviated in the upper region, without compromising gate activation through the higher dopant concentration in the lower region. Accordingly, extension, source/drain, and/or halo implants may be optimized without any corresponding detrimental poly-Si depletion and dopant penetration problems.

Figure 1:
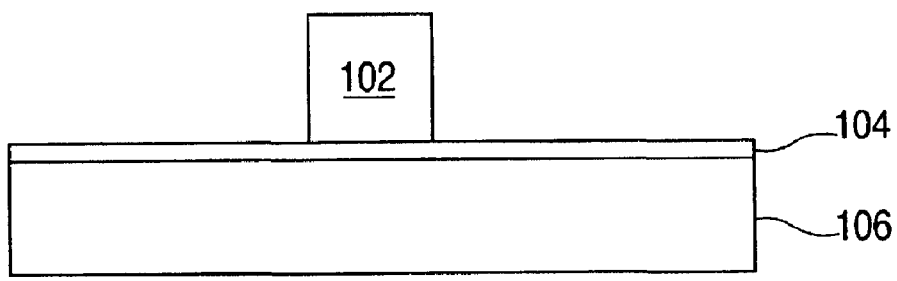
FIGS. 1–12 illustrate a sequence of exemplary processing steps that may be employed to form a gate structure for a MOS transistor device, the gate structure having an independently tailored vertical doping profile, in accordance with an embodiment of the invention.

Referring generally now to the Figures, there is shown a sequence of exemplary process steps that may be employed in the formation of the vertically tailored gate structure for MOS transistors. In FIG. 1, a polysilicon (poly-Si) block 102 is initially defined upon a gate dielectric layer 104, (such as a gate oxide layer, for example) that is in turn formed upon a substrate 106. The substrate 106 may be any suitable semiconductor substrate known to those skilled in the art, such as silicon substrate or a multi-layer silicon-on-insulator (SOI) substrate, with the gate dielectric layer 104 being formed thereupon. The gate dielectric layer 104 may be formed, for example, by oxidizing the substrate 106 or by deposition of an oxide layer upon the substrate 106. Then, a first layer of poly-Si is deposited, patterned and etched to form the poly-Si block 102, which will become part of the novel gate stack structure generally described above.

Figure 2:
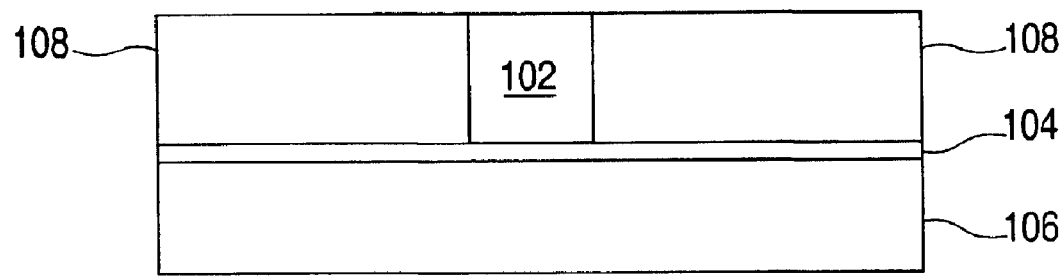
Figure 3:
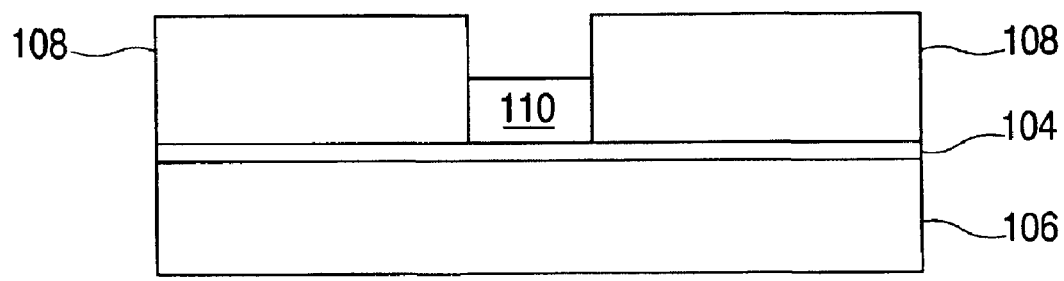
Figure 4:
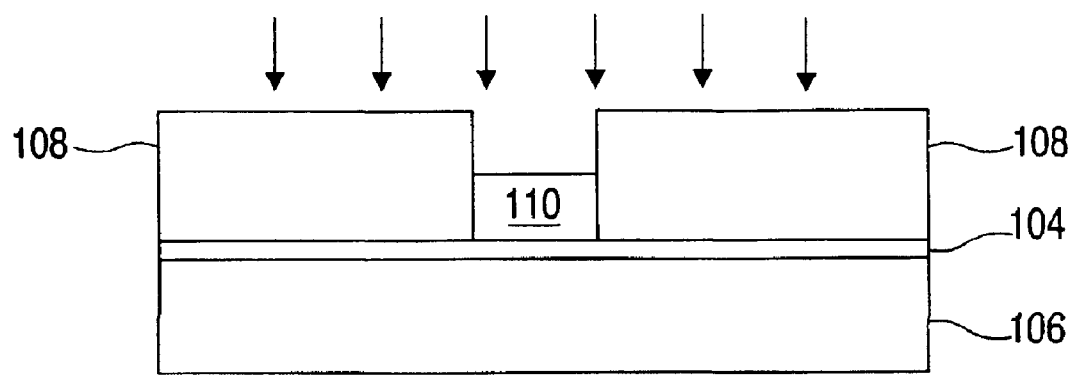

Once the poly-Si block 102 is formed, a sacrificial layer (e.g., an oxide layer) 108 is deposited over the gate dielectric layer 104 and the poly-Si block 102, and is thereafter planarized down to the top of the poly-Si block, as shown in FIG. 2. Then, in FIG. 3, the poly-Si block 102 is recessed by selective etching to form the first layer of the gate structure, referred to hereinafter as a lower poly-Si region 110. At this point, a first ion implantation process for the lower poly-Si region 110 is executed, as illustrated in FIG. 4, so as to provide the higher dopant concentration sufficient for gate activation and prevention of depletion effects. If the desired thickness of the lower poly-Si region 110 is relatively thin, the tail of the implant can extend into the channel. In such a case, the first ion implant may be done before the poly-Si block 102 is recessed.

Suitable dopants include, but are not limited to, boron (B), phosphorous (P), arsenic (As), and $BF_2$. Depending on the particular dopant or combination of dopants, the concentration thereof will vary. However, an exemplary dopant concentration for the lower poly-Si region is about $1 \times 10^{21}$ atoms/cm$^3$.

Figure 5:
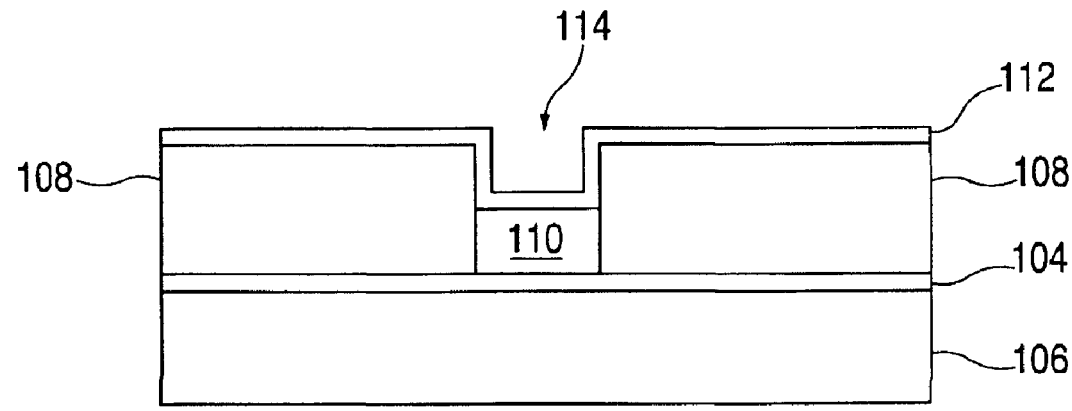

FIG. 5 illustrates the formation of a conducting barrier layer 112 atop the oxide layer 108 and the lower poly-Si region 110. The conducting barrier layer 112, as discussed later, will serve to prevent dopant diffusion (both poly-Si dopants and halo/extension implant dopants) between upper and lower poly-Si regions. A metal such as tungsten nitride (WN) is a preferred material for barrier layer 112 due to its electrically conductive properties and its functionality as a barrier layer, and may be deposited atop oxide layer 108 and the lower poly-Si region 110 by chemical vapor deposition (CVD). Other suitable materials for the barrier layer include tantalum nitride (TaN), titanium nitride (TiN), tungsten silicon nitride (WSiN), tantalum silicon nitride (TaSiN), aluminum titanium nitride (AlTiN), titanium silicide (TiSi), and quantum conductive semi-insulating barriers made from ultra-thin dielectrics (e.g., SiN or SiON), and combinations thereof. The formation of the barrier layer 112 over the lower poly-Si region 110 is implemented with a substantially uniform thickness so as to leave a recess 114 in which an upper poly-Si region of the gate will be formed.

Figure 6:
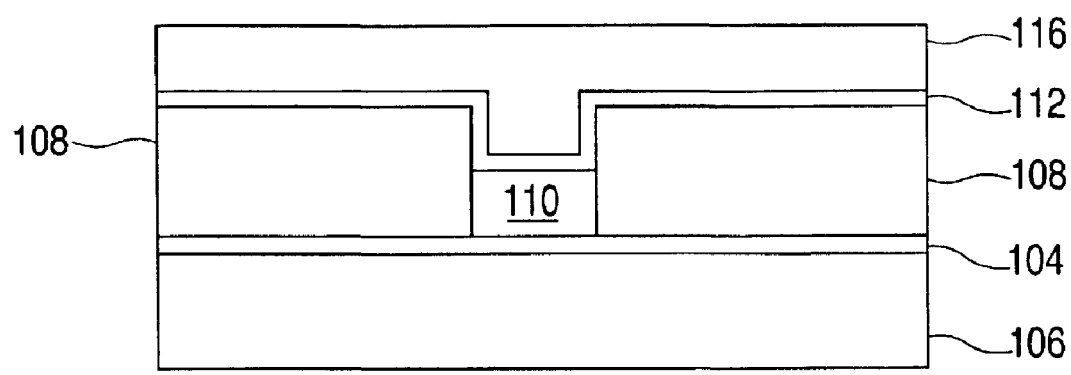
Figure 7:
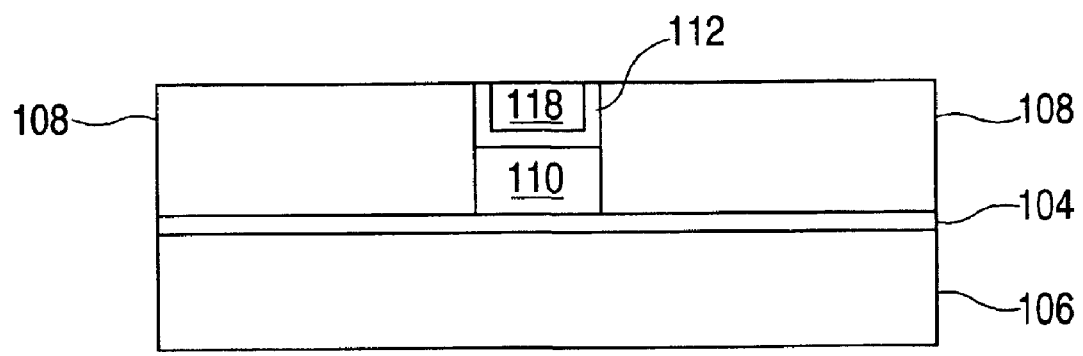
Figure 8:
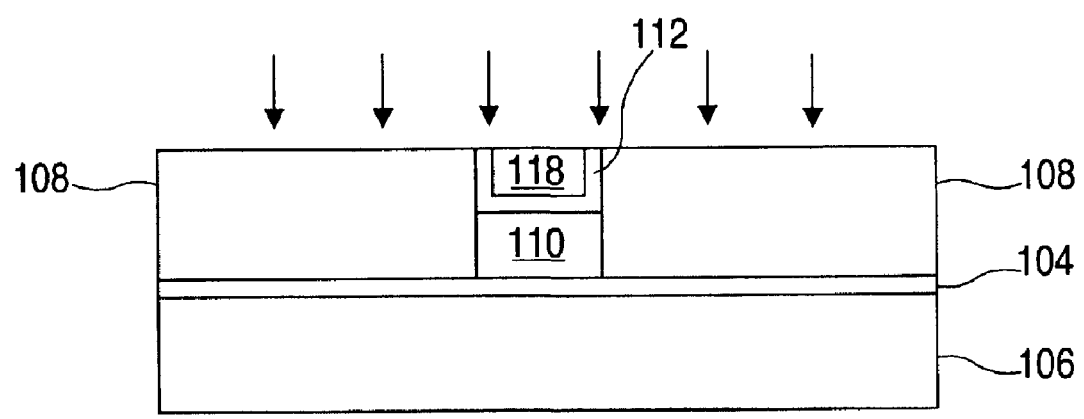

Next, as shown in FIG. 6, a second layer of poly-Si 116 is deposited upon the first barrier layer 112 and then planarized down to the oxide layer 108, as shown in FIG. 7, to form an upper poly-Si region 118. The second layer of poly-Si 116 may be of the same conductivity type as that of the first poly-Si layer used to form the poly-Si block 102 of FIGS. 1 and 2. Alternatively, the second layer 116 may be of the opposite conductivity of the first poly-Si layer. In FIG. 8, a second ion implantation process is shown, wherein the dopant concentration thereof is preferably less than the dopant concentration of the first implantation process, so as not to compromise the integrity of a subsequent silicide formation. Again, the particular implant concentration will depend upon the specific dopant used, but an exemplary concentration for the second layer 116 is on the order of about $3 \times 10^{20}$ atoms/cm$^3$.

Figure 9:
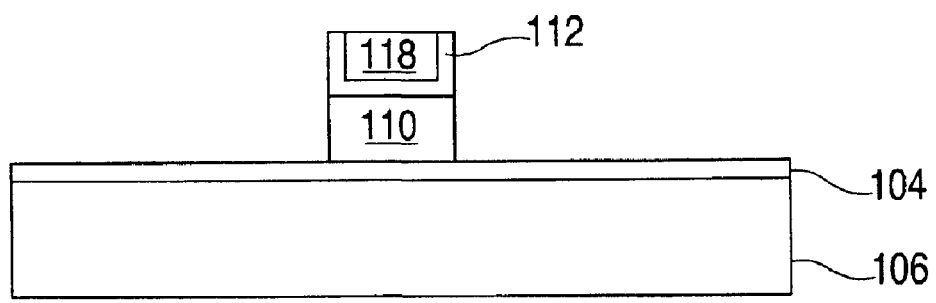
Figure 10:
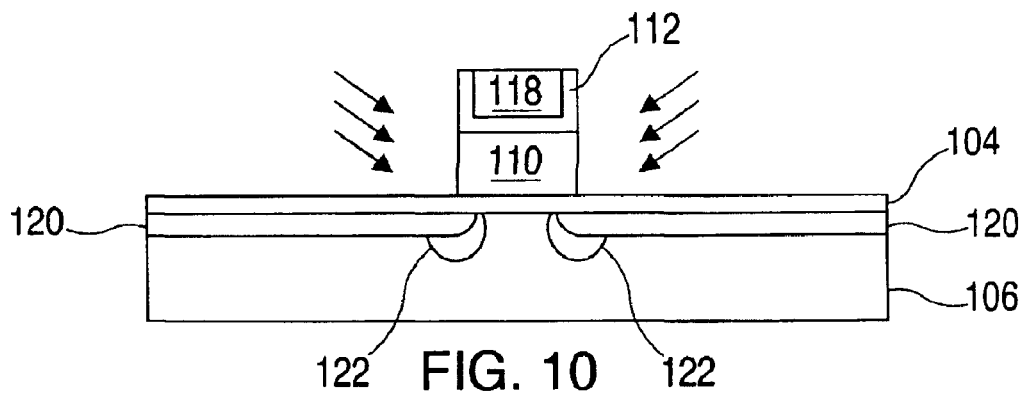
Figure 11:
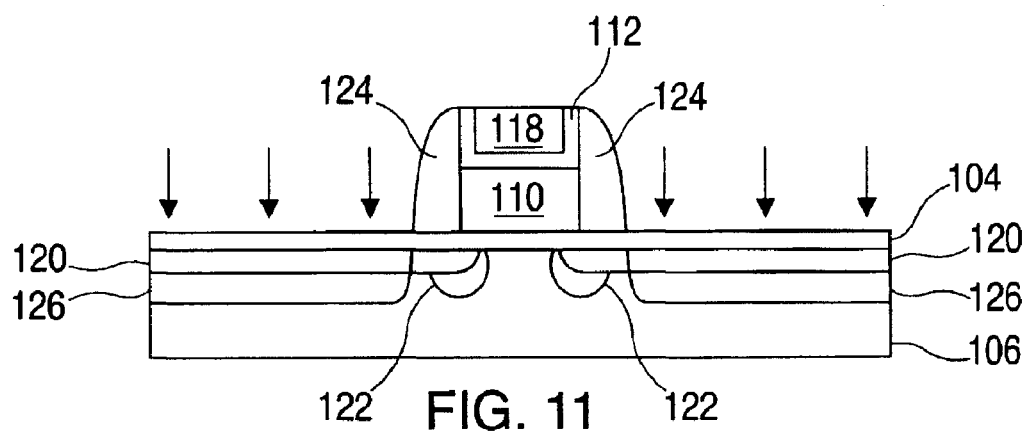

Referring now to FIG. 9, the oxide layer 108 is removed by etching for the formation of the diffusion regions (i.e., source and drain regions) and for the extension and halo implants that are characteristic of MOS devices. In particular, FIG. 10 shows the extension implant regions 120 and the angled implantation of halo implant regions 122. Then, in FIG. 11, source/drain spacers 124 are defined in a conventional manner prior to the implantation of the source/drain diffusion regions 126. The device is then annealed at high temperature (e.g., from about 700EC to about 1300EC, and preferably from about 900EC to about 1100EC) to activate the diffusion regions 126.

Due to the presence of the conductive barrier layer 112, there is no significant change in dopant concentration as between the high-dose, lower poly-Si region 108 and the low-dose, upper poly-Si region 118 during the anneal. In other words, without the presence of the barrier layer 112, the anneal process would result in an equalization of the doping in the lower and upper poly-Si regions. Moreover, any fluorine or carbon atoms implanted during the source/drain or extension/halo formation process will remain in the upper poly-Si region 118 during the anneals. Therefore, a complete separation of dopants and impurities between the top of the gate and bottom of the gate is achieved.

Figure 12:
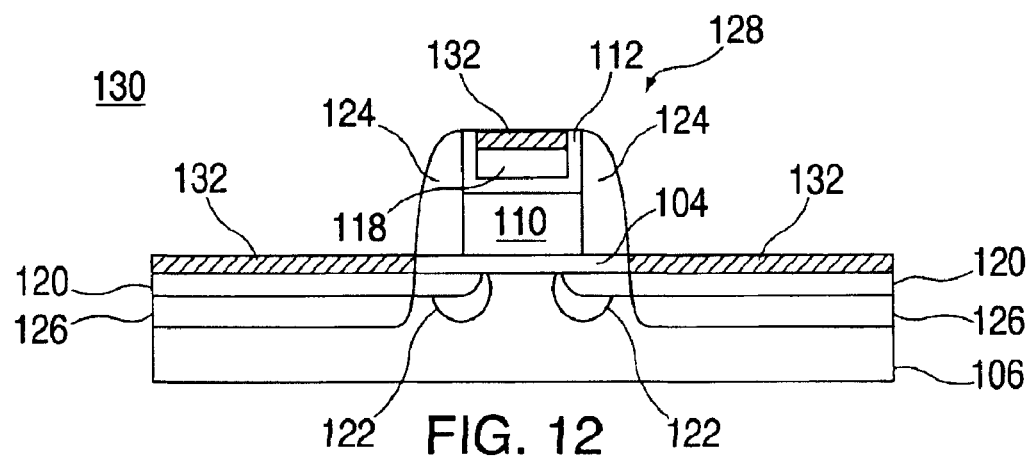

Finally, FIG. 12 illustrates the completion of the formation of the gate structure, (denoted generally by 128) and MOS transistor 130 following a silicidation step in which silicide layers 132 are formed upon the source/drain diffusion region 120, as well as on the upper poly-Si region 118 of the gate structure. Suitable materials for the silicide layers 132 include, but are not necessarily limited to, cobalt silicide (CoSi), titanium silicide (TiSi), and nickel silicide (NiSi). As a result of the relatively light dopant concentration in the upper poly-Si region 118, the difficulties in silicidation are avoided.

As will be further appreciated, the above described gate structure is also applicable for a Si/SiGeC (upper/lower) poly-Si stack, in which the poly-Si depletion effects are further decreased since the solubility of dopants in SiGeC poly is higher. Accordingly, if SiGeC is used for the upper or lower poly region, it is preferably doped at a relatively high concentration in order to utilize the increase in solubility thereof, while the Si in the upper poly region should be doped more lightly to prevent silicidation problems.

Another benefit of the disclosed gate structure stems from the fact that extension, source/drain, and/or halo implants that are also implanted into the gate can cause certain problems for MOS devices. In a PFET device, for example, the extension and source/drain implants may contain $BF_2$ since shallower junctions may be achieved therewith, as opposed to boron for the same thermal budget. On the other hand, the presence of fluorine in the gate further enhances the diffusion of dopants from the gate through the gate dielectric into the underlying channel region. The extra dopant in the channel region is detrimental to high performance MOS devices, and especially with ultra-thin oxides (e.g., <15 Å) and high-k dielectrics that are currently being developed in the semiconductor industry.

However, with the conductive barrier layer of the above gate structure, the bottom of the gate should be protected from fluorine penetration through the gate dielectric. This also applies to the presence of a diffusion retarding species, such as carbon. In certain instances, it is desirable to implant the source/drain and/or extension regions with a diffusion retarding species in order to obtain ultra-shallow junctions and ultra-sharp halos. But, if carbon is present in the lower region gate, the dopants are hindered from diffusing to the bottom of the gate, and thus the resulting poly depletion will be detrimental to the performance of the MOS device. Again, the conductive barrier layer serves to protect the lower poly-Si region of the gate from any diffusion retarding species.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a gate structure for a semiconductor transistor, the method comprising:

forming a lower polysilicon on a gate dielectric layer;

implanting said lower polysilicon region with a dopant at a first dopant concentration;

forming a conductive barrier layer upon said lower polysilicon region;

forming an upper polysilicon region upon said conductive barrier layer; and implanting said upper polysilicon region with dopant at a second dopant concentration, said second concentration being different than said first concentration;

wherein said lower polysilicon region comprises silicon germanium carbon (SiGeC).

2. The method of claim 1, further comprising forming a silicide layer on said upper polysilicon region.

3. The method of claim 1, wherein said conductive barrier is selected from the group of: tungsten nitride (WN), tantalum nitride (TaN). titanium nitride (TiN), tungsten silicon nitride (WSiN), tantalum silicon nitride (TaSiN), aluminum titanium nitride (AlTiN), titanium silicide (TiSi), quantum conductive semi-insulating barriers, and combinations comprising at least one of the foregoing.

4. The method of claim 1, wherein said upper polysilicon region is formed directly upon a top surface of said conductive barrier layer.

5. The method of claim 1, wherein said second concentration is less than said first concentration.

6. A method for forming a gate structure for a semiconductor transistor, the method comprising:

forming a lower polysilicon region on a sate dielectric layer;

implanting said lower polysilicon region with a dopant at a first dopant concentration;

forming a conductive barrier layer upon said lower polysilicon region;

forming an upper polysilicon region upon said conductive barrier layer; and implanting said upper polysilicon region with dopant at a second dopant concentration, said second concentration being different than said first concentration;

wherein said lower polysilicon region is doped at a concentration of about $1 \times 10^{21}$ atoms/cm$^3$, and said upper polysilicon region is doped at a concentration of about $3 \times 10^{20}$ atoms/cm$^3$.

7. The method of claim 6, further comprising forming a silicide layer on said upper polysilicon region.

8. The method of claim 6, wherein said conductive barrier is selected from the group of: tungsten nitride (WN), tantalum nitride (TaN), titanium nitride (TiN), tungsten silicon nitride (WSiN), tantalum silicon nitride (TaSiN), aluminum titanium nitride (AlTiN), titanium silicide (TiSi), quantum conductive semi-insulating barriers, and combinations comprising at least one of the foregoing.

9. The method of claim 6, wherein said upper polysilicon region is formed directly upon a top surface of said conductive barrier layer.

10. A method for forming a gate structure for a semiconductor transistor, the method comprising:

forming a lower polysilicon region on a gate dielectric layer by defining a polysilicon block on said gate dielectric layer, forming a sacrificial layer over said gate dielectric layer and said polysilicon block, planarizing said sacrificial layer down to the top of said polysilicon block, and recessing said polysilicon block below the top of the planarized sacrificial layer;

implanting said lower polysilicon region with a dopant at a first dopant concentration;

forming a conductive barrier layer upon said lower polysilicon region;

forming an upper polysilicon region upon said conductive barrier layer; and implanting said upper polysilicon region with dopant at a second dopant concentration, said second concentration being different than said first concentration.

11. The method of claim 10, further comprising forming a silicide layer on said upper polysilicon region.

12. The method of claim 10, wherein said conductive barrier is selected from the group of: tungsten nitride (WN), tantalum nitride (TaN), titanium nitride (TIN), tungsten silicon nitride (WSiN), tantalum silicon nitride (TaSiN). aluminum titanium nitride (AlTiN), titanium silicide (TiSi), quantum conductive semi-insulating barriers, and combinations comprising at least one of the foregoing.

13. The method of claim 10, wherein said upper polysilicon region is formed directly upon a top surface of said conductive barrier layer.

14. The method of claim 10, wherein said second concentration is less than said first concentration.

* * * * *